US009275866B2

(12) United States Patent
Gluschenkov et al.

(10) Patent No.: US 9,275,866 B2
(45) Date of Patent: Mar. 1, 2016

(54) GAS CLUSTER REACTOR FOR ANISOTROPIC FILM GROWTH

(71) Applicant: International Business Machines Corporation, Armonk, NY (US)

(72) Inventors: Oleg Gluschenkov, Poughkeepsie, NY (US); Ahmet S. Ozcan, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/277,857

(22) Filed: May 15, 2014

(65) Prior Publication Data

US 2015/0332927 A1  Nov. 19, 2015

(51) Int. Cl.
*H01L 21/44* (2006.01)
*H01L 21/285* (2006.01)
*H01J 37/305* (2006.01)
*H01J 37/30* (2006.01)
*H01L 21/02* (2006.01)
*H01L 21/3205* (2006.01)
*C23C 14/02* (2006.01)

(52) U.S. Cl.
CPC .......... *H01L 21/28575* (2013.01); *C23C 14/02* (2013.01); *H01J 37/3002* (2013.01); *H01J 37/3053* (2013.01); *H01L 21/02068* (2013.01); *H01L 21/28506* (2013.01); *H01L 21/28518* (2013.01); *H01L 21/3205* (2013.01); *H01J 2237/30472* (2013.01); *H01J 2237/3174* (2013.01)

(58) Field of Classification Search
CPC .................. H01L 21/28575; H01L 21/02068; H01L 21/28518; H01J 37/3053; H01J 37/3002; C23C 14/02
USPC ........................................................ 438/660
See application file for complete search history.

(56) References Cited

U.S. PATENT DOCUMENTS 6,344,116 B2   2/2002  Warner, Jr. et al.
6,451,638 B1   9/2002  Zhang et al.
(Continued)

FOREIGN PATENT DOCUMENTS

JP     02080554 A    3/1990
JP   2000087227 A    3/2000
(Continued)

OTHER PUBLICATIONS

Yamada et al., "Ionized Cluster Beams: Physics and Technology", Jpn. J. Appl. Phys., vol. 32 (1993) pp. 2121-2141 Part 1, No. 5A, May 1993.
(Continued)

*Primary Examiner* — Savitr Mulpuri
(74) *Attorney, Agent, or Firm* — L. Jeffrey Kelly; Steven Meyers

(57) ABSTRACT

A method of forming a low temperature silicide film on a substrate includes supplying a source gas to a cluster formation chamber to form a gas cluster that is subsequently moved to an ionization-acceleration chamber to form a gas cluster ion beam (GCIB). The GCIB is injected into a processing chamber containing the substrate. A precursor gas is injected through an injection device located on a top portion of the processing chamber to form a silicide film on the substrate by bombarding the substrate with the GCIB in the presence of the precursor gas.

12 Claims, 3 Drawing Sheets

(56) References Cited

U.S. PATENT DOCUMENTS

| | | | |
|---|---|---|---|
| 8,372,489 B2 | 2/2013 | Hautala | |
| 2003/0141573 A1 | 7/2003 | Ross | |
| 2010/0200774 A1 | 8/2010 | Burke et al. | |
| 2011/0117738 A1* | 5/2011 | Russell et al. | 438/664 |
| 2011/0272593 A1* | 11/2011 | Graf et al. | 250/423 R |
| 2013/0059444 A1* | 3/2013 | Shao et al. | 438/706 |
| 2013/0059446 A1* | 3/2013 | Tabat et al. | 438/708 |

FOREIGN PATENT DOCUMENTS

WO 8802790 A1 4/1988
WO 0026431 A1 5/2000

OTHER PUBLICATIONS

Yamada et al., "Current Research and Development Topics on Gas cluster Ion-Beam Processes", J. Vac. Sci. Technol. A23 (4), Jul./Aug. 2005, pp. 1090-1099.

Pending U.S. Appl. No. 14/831,900, filed Aug. 21, 2015, entitled: "Gas Cluster Reactor for Anisotropic Film Growth", 16 pages.

IBM: List of IBM Patents or Patent Applications Treated As Related (Appendix P), Sep. 11, 2015, 2 pages.

Pending U.S. Appl. No. 14/831,900, filed Aug. 21, 2015 entitled: "Gas Cluster Reactor for Anisotropic Film Growth", 16 pages.

* cited by examiner

GAS CLUSTER REACTOR FOR ANISOTROPIC FILM GROWTH

BACKGROUND

The present invention generally relates to semiconductor manufacturing and more particularly to low-temperature silicide film growth.

Complementary metal-oxide-semiconductor (CMOS) technology is commonly used for fabricating field effect transistors (FETs) as part of advanced integrated circuits (IC), such as CPUs, memory, storage devices, and the like. Most common among these may be metal-oxide-semiconductor field effect transistors (MOSFETs). In a typical MOSFET, a gate structure may be energized to create an electric field in an underlying channel region of a substrate, by which charge carriers are allowed to travel through the channel region between a source region and a drain region. As ICs continue to scale downward in size, the use of high carrier mobility materials in the channel region may be considered to boost device performance for the 14 nm node and beyond. Group III-V materials, such as gallium arsenide (GaAs) and indium gallium arsenide (InGaAs), may be potential candidates to replace silicon (Si) as the channel material.

SUMMARY

The ability to conduct low temperature silicide film growth as well as in-situ pre-clean of a substrate may facilitate implementing new generation Group III-V channel materials in current CMOS technology.

A method of forming a low temperature silicide film on a substrate may include supplying a source gas to a cluster formation chamber to form a gas cluster that may be moved to an ionization-acceleration chamber to form a gas cluster ion beam (GCIB). The GCIB may be injected into a processing chamber containing the substrate. A precursor gas may be injected through an injection device into the processing chamber to form a silicide film on the substrate by bombarding the substrate with the GCIB in the presence of the precursor gas.

A method of performing in-situ cleaning of a substrate may include supplying an etchant gas to a cluster formation chamber to form a gas cluster that may be subsequently moved to an ionization-acceleration chamber to form a gas cluster ion beam (GCIB). The GCIB may be injected into a processing chamber containing the substrate and bombarding the substrate with the GCIB to remove contaminants on the substrate.

A gas cluster ion beam (GCIB) device may include a source gas cluster formation chamber, an ionization-acceleration chamber connected to the cluster formation chamber, a processing chamber connected to the ionization-acceleration chamber, a precursor gas injection device positioned on a top portion of the processing chamber such that the precursor gas is directed at a surface of a substrate contained within the processing chamber, and an opening between the ionization-acceleration chamber and the processing chamber.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
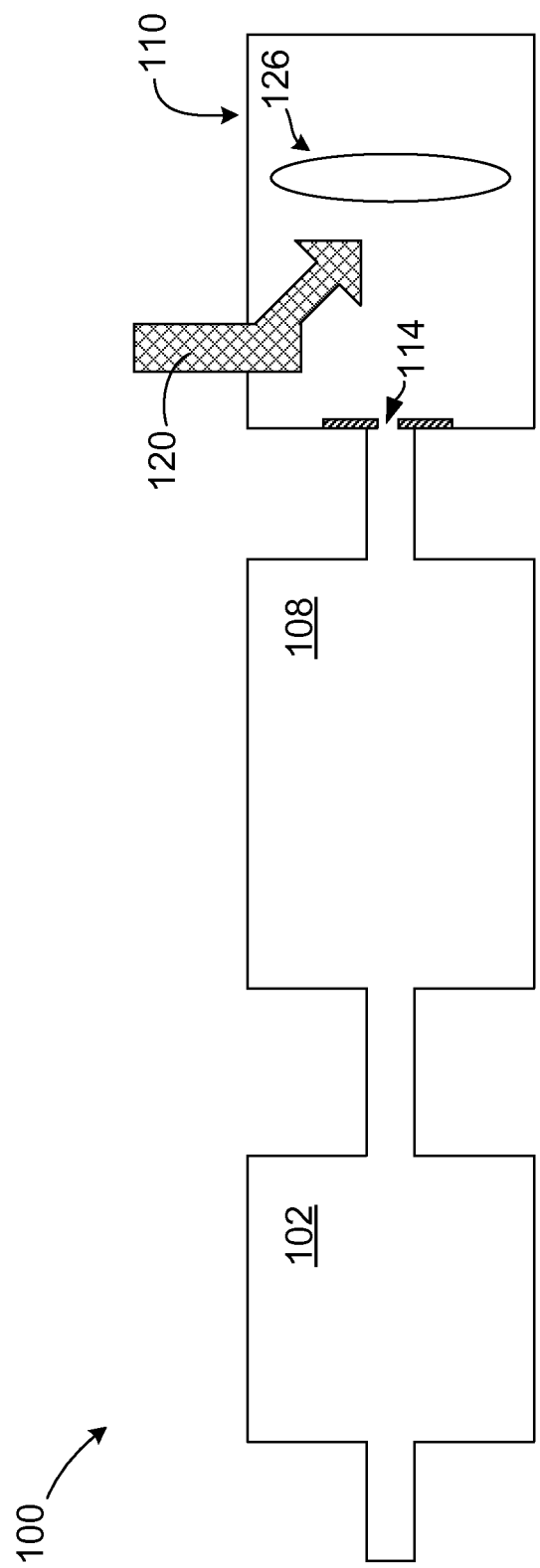
FIG. 1 is a cross-sectional view of a gas cluster ion beam (GCIB) device, according to an embodiment of the present invention.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As the semiconductor industry continues to scale down the size of devices, a new generation of high carrier mobility channel materials have been considered to further improve device performance. Group III-V materials, such as GaAs and InGaAs, may be potential candidates to replace Si as the channel material. However, fabricating low resistance contacts on source and drain regions formed in these Group III-V materials may pose challenges to their implementation. One possible challenge may include forming a low resistance silicide on a complex material such as InGaAs. In such cases, the physical properties of the Group III-V materials may require a deposition temperature lower than 400° C. when forming a silicide, which may in turn limit the choice of silicide materials. Therefore, formation of self-aligned silicide contacts using traditional methods, which may include metal film deposition and high temperature annealing, may not be compatible with silicide film growth on Group III-V materials.

Current technologies, such as gas cluster ion beam (GCIB) processes, may exhibit unique nonlinear effects that may be valuable for surface processing applications, and in particular, low-temperature silicide film formation. By adding an injection device to a processing chamber of a GCIB device, embodiments of the present disclosure may, among other potential benefits, conduct a low-temperature anisotropic deposition such that a highly conductive silicide film may be grown directly on a surface of the Group III-V material. This low-temperature anisotropic deposition may reduce silicide contact resistance and potentially improve device performance.

The present invention generally relates to semiconductor manufacturing and more particularly to low-temperature silicide film growth. A low-temperature silicide film deposition may be conducted by modifying a GCIB device. One way to modify the GCIB device to conduct low-temperature silicide film growth may include adding an injection device to a processing chamber of the GCIB device. One embodiment by which to form the silicide film on a Group III-V material surface using the modified GCIB device is described in detail below by referring to the accompanying drawings in FIGS. 1-2.

Referring now to FIG. 1, a gas cluster ion beam (GCIB) device 100 is shown, according to an embodiment of the present disclosure. In the depicted embodiment, the GCIB device 100 may include a cluster formation chamber 102, an ionization-acceleration chamber 108 and a processing chamber 110 in which a substrate 126 may be placed to be processed. An aperture 114 may control the size of a subsequently formed gas cluster ion beam. The aperture 114 may have a width capable of creating a collimated gas cluster ion beam as described in FIG. 2.

The GCIB device 100 may be configured to produce a gas cluster ion beam suitable for treating the substrate 126. In the depicted embodiment, the substrate 126 may include a semiconductor wafer made from any of several known semiconductor materials including, but not limited to, silicon, germanium, silicon-germanium alloy, carbon-doped silicon, carbon-doped silicon-germanium alloy, and compound (e.g. Group III-V and Group II-VI) semiconductor materials. Non-limiting examples of compound semiconductor materials include GaAs, InAs and/or InGaAs. In one exemplary embodiment, the substrate 126 may include GaAs.

The GCIB device 100 may further include an injection device 120 located on a top portion of the processing chamber 110. The injection device 120 may be positioned relative to the substrate 126. More specifically, the position of the injection device 120 may allow directional injection of a subsequently inserted precursor gas for localized treatment of the substrate 126. In one embodiment, the injection device may be positioned on an angle of approximately 45° with respect to the plane of the substrate 126. However, it should be noted that the injection device 120 may be positioned at any inclination angle that may allow localized treatment of areas of the substrate 126. The injection device 120 may include, for example, a showerhead device having a plurality of openings through which the precursor gas may flow.

Figure 2:
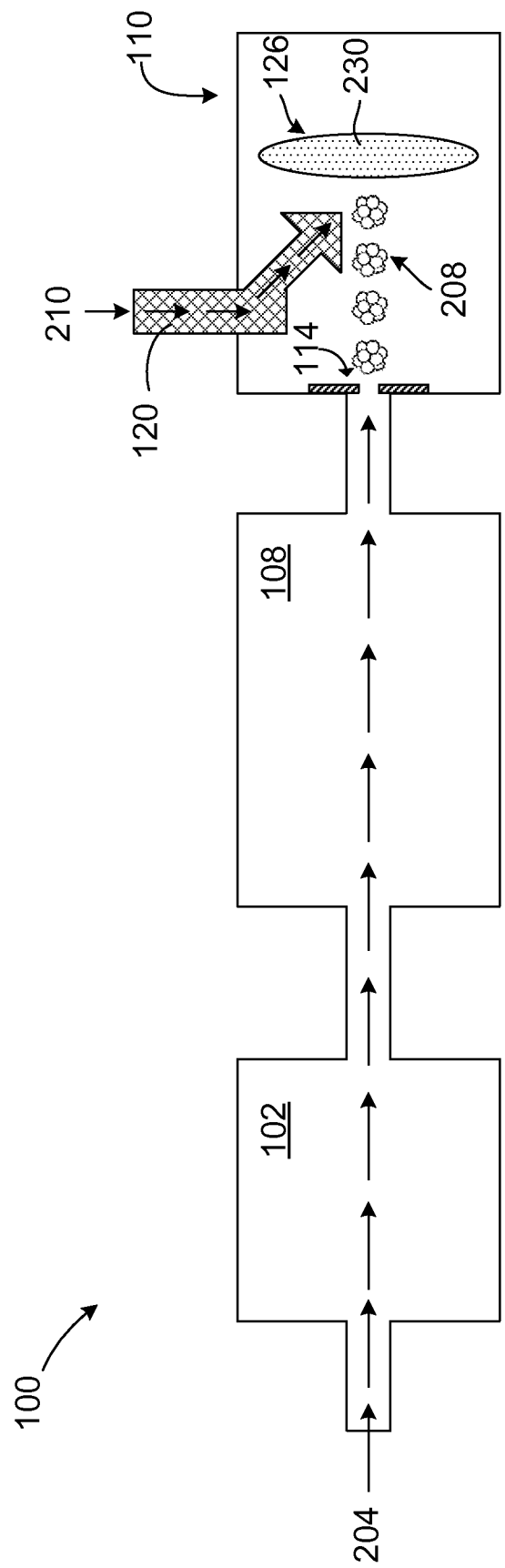
FIG. 2 is a cross-sectional view of a GCIB device depicting forming a gas cluster ion beam and injecting a precursor gas to form a silicide film on a substrate, according to an embodiment of the present invention.

Referring now to FIG. 2, a source gas 204 may be supplied to the cluster formation chamber 102 to form a gas cluster beam (not shown) that may be subsequently ionized and accelerated in the ionization-acceleration chamber 108 to form a gas cluster ion beam 208 (hereinafter "GCIB"). The GCIB 208 may be used to form a silicide film 230 on the substrate 126 contained in the processing chamber 110.

The processing steps involved in the formation of the GCIB 208 are well known to those skilled in the art and may include forming a gas cluster in the cluster formation chamber 102 by expansion of the source gas 204 at high pressure through a room temperature nozzle (not shown) into vacuum. Then, gas clusters may enter the ionization-acceleration chamber 108 located downstream of the cluster formation chamber 102. Once in the ionization-acceleration chamber 108, a second vacuum stage may take place where gas clusters may be ionized by electron bombardment and then accelerated to a high potential ranging from approximately 1 keV to approximately 100 keV. The energy range of the GCIB 208 may vary according to the envisioned use for the GCIB device 100. For the purpose of silicide film growth, the GCIB 208 may have an energy range varying from approximately 10 keV to approximately 60 keV.

In some embodiments, magnetic filtering of the GCIB 208 may be conducted prior to a subsequent vacuum stage performed in the processing chamber 110 in order to reduce monomer ion contamination. The resulting beam may include cluster ions with a size distribution that may range from a few hundred atoms to several thousand atoms. In one embodiment, the GCIB 208 size distribution may vary between approximately 100 atoms/cluster to approximately 20,000 atoms/cluster. In another embodiment, the GCIB 208 size distribution may vary between approximately 5,000 atoms/cluster to approximately 10,000 atoms/cluster.

At this point, a neutralizer assembly (not shown) connected to the processing chamber 110 may inject low energy electrons into the GCIB 208 in order to decrease space charge blow-up and to avoid charge build-up on nonconductive substrates. When the GCIB 208 enters the processing chamber 110, mechanical scanning may be used for uniform treatment of the substrate 126. In some embodiments, a Faraday current monitor (not shown) may be used for dose control of the GCIB 208. The dose of GCIB 208 may range from approximately $1 e^{12}$ clusters/cm$^2$ to approximately $1 e^{18}$ clusters/cm$^2$.

Depending upon the application, the gas clusters may be produced from a variety of gases. For the purpose of silicide film growth, the source gas 204 may include any metal or silicon-containing gas suitable for silicide formation. In one embodiment, the source gas 204 may include a silicon-source gas such as SiH$_2$Cls (DCS), Si$_2$H$_6$, SiCl$_4$ and SiHCl$_3$. In another embodiment, the source gas 204 may include a metal-source gas such as TiCl$_4$, WF$_6$, and metal amidinates, including cobalt and nickel based amidinates.

With continued reference to FIG. 2, a precursor gas 210 may be introduced into the processing chamber 110 through the injection device 120. The precursor gas 210 may be directionally injected in order to reach a surface of the substrate 126. The precursor gas 210 may include any metal or silicon containing gas suitable for silicide formation. In one embodiment, the precursor gas 210 may include a silicon-source gas such as SiH$_2$Cls (DCS), Si2H$_6$, SiCl$_4$ and SiHCl$_3$. In another embodiment, the precursor gas 210 may include a metal-source gas such as TiCl$_4$, WF$_6$, and metal amidinates, including cobalt and nickel based amidinates.

It should be understood that if the source gas 204 includes a silicon-source gas, the precursor gas 210 may include a metal-source gas and vice versa.

In one embodiment, the precursor gas 210 and the GCIB 208 may be simultaneously injected into the processing chamber 110 for processing of the substrate 126. In this embodiment, simultaneous cluster ion bombardment and precursor gas exposure may occur on the substrate 126, adhesion of atoms (or molecules) of the precursor gas 210 on the substrate 126 may be predominantly facilitated by the energetic cluster ions which may induce a chemical reaction at the substrate surface to promote growth of the silicide film 230. Therefore, the growth rate of the silicide film 230 may be controlled by the GCIB 208 flux.

It should be noted that, in embodiments where the precursor gas 210 and the GCIB 208 may be simultaneously injected into the processing chamber 110, the precursor gas 210 and the GCIB 208 may collide prior to reaching the substrate 126. These collisions may cause the gas clusters to lose energy before reaching the substrate 126 which may affect the deposition process. In order to reduce collisions between the precursor gas 210 and the GCIB 208, pressure in the processing chamber 110 may be kept low enough such that collisions are minimized. For example, pressure in the processing chamber 110 may be kept in a range varying from approximately $10^{-6}$ Torr to approximately $10^{-2}$ Torr in order to minimize collisions between the precursor gas 210 and the GCIB 208 prior to reaching the substrate 126.

In another embodiment, the precursor gas 210 may be introduced to the processing chamber 110 in cycles of precursor gas injection followed by GCIB injection and vice versa. Stated differently, a cyclic deposition in which pulses of precursor gas 210 injection followed by GCIB 208 bombardment may be conducted to form the silicide film 230 on the substrate 126. It should be noted that growth of the silicide film 230 may occur layer by layer. In this embodiment, one or more monolayers of the precursor material on the substrate surface may react with the incoming energetic gas cluster ions, which may result in growth of the silicide film 230. The thickness of the silicide film 230 may be controlled by the number of precursor gas 210 and GCIB 208 pulses.

The processing chamber 110 may further include a mechanical scanning system which may allow the substrate 126 to move in different directions so that the entire surface of the substrate 126 may be reached by the GCIB 208 and the precursor gas 210. As a result, a silicide film 230 having a substantially even thickness may be formed on the substrate 126.

It should be understood that the terms "growth and/or deposition" and "formed and/or grown" mean the growth of a material on a deposition surface such as the substrate 126.

The GCIB 208 together with the precursor gas 210, injected via the injection device 120 in the processing chamber 110, may provide a low-temperature thin-film deposition process that may facilitate the formation of a silicide film on the substrate 126 with enhanced density, adhesion, smoothness, crystallinity, and electrical characteristics that silicide films deposited by typical deposition techniques may not exhibit. Also, because the GCIB process is anisotropic, the silicide film may be substantially deposited in surfaces perpendicular to the direction of the GCIB 208, having minimal impact on surfaces of the substrate 126 that are parallel to the GCIB 208.

In another embodiment, the GCIB 208 may be used to conduct an in-situ pre-clean of the substrate 126 prior to forming the silicide film 230. Pre-cleaning of the substrate 126 may remove contaminants and produce a uniform substrate surface which may benefit further processing steps, including the formation of the silicide film 230. In this embodiment, the source gas 204 may include any suitable etchant gas such as, for example, $NF_3$.

Another embodiment by which to modify the GCIB device to conduct low-temperature silicide film growth on a Group III-V material is described in detail below by referring to the accompanying drawing in FIG. 3. The present embodiment may include modifying an aperture of the processing chamber and adding an injection device to the processing chamber of the GCIB device.

Figure 3:
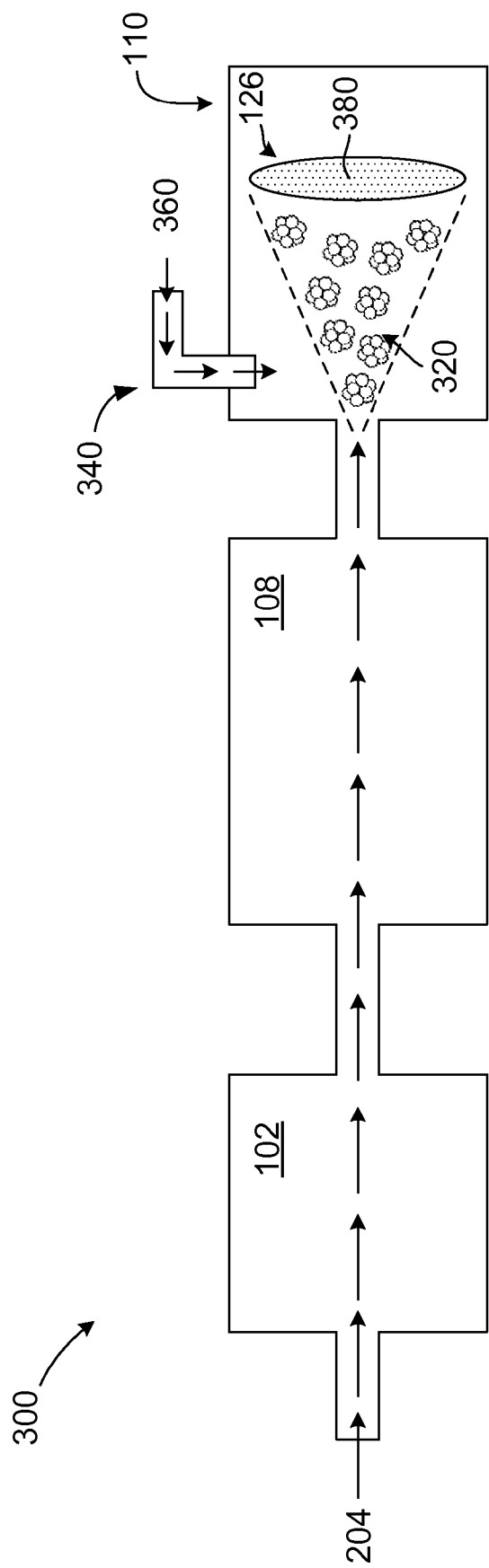
FIG. 3 is a cross-sectional view of a GCIB device depicting forming a broad gas cluster ion beam and injecting a precursor gas to form a silicide film on a substrate, according to an alternate embodiment of the present invention.

Referring now to FIG. 3, a broad GCIB 320 may be formed in the GCIB device 300, according to an alternate embodiment of the present disclosure. In this embodiment, the aperture 114 (FIG. 2) may be modified such that it has a width capable of increasing the cluster distribution size to form the broad GCIB 320. By doing so, the broad GCIB 320 may reach a substantially larger area of the substrate 126 than the GCIB 208 (FIG. 2). In an embodiment, the aperture 114 (FIG. 2) may remain in place, but may be widened to form the broad GCIB (FIG. 2). In the depicted embodiment, the aperture 114 (FIG. 2) may be removed entirely to form the broad GCIB 320 which may be able to bombard the entire surface of the substrate 126. In embodiments where the broad GCIB 320 may be formed, mechanical scanning of the substrate 126 may not be required to achieve a uniform treatment of the substrate 126. It should be understood that the broad GCIB 320 may be formed from a source gas similar to the source gas 204 described above with reference to FIG. 2.

Furthermore, different pressure and nozzle size combinations may be required to increase the broad GCIB 320 intensity and achieve a larger distribution size. In one embodiment, the broad GCIB 320 size distribution may vary between approximately 100 atoms/cluster to approximately 20,000 atoms/cluster. In another embodiment, the GCIB 320 size distribution may vary between approximately 5,000 atoms/cluster to approximately 10,000 atoms/cluster.

In the depicted embodiment, the broad GCIB 320 may include an energy range varying from approximately 10 keV to approximately 60 keV and may be injected in doses ranging from approximately 1 $e^{12}$ clusters/cm$^2$ to approximately 1 $e^{18}$ clusters/cm$^2$.

An injection device 340 may be added to the processing chamber 110. Similarly to the injection device 120 shown in FIG. 1, the injection device 340 may be located on a top portion of the processing chamber 110. The injection device 340 may be positioned relative to the substrate 126. However, unlike the injection device 120 (FIG. 1), the injection device 340 may not necessarily allow directional injection of a subsequently inserted precursor gas 360 for treatment of the substrate 126.

Next, a precursor gas 360 may be introduced into the processing chamber 110 via the injection device 340. The precursor gas 360 may include any metal or silicon containing gas suitable for silicide formation. In one embodiment, the precursor gas 360 may include a silicon-source gas such as $SiH_2Cl_s$ (DCS), $Si_2H_6$, $SiCl_4$ and $SiHCl_3$. In another embodiment, the precursor gas 360 may include a metal-source gas such as $TiCl_4$, $WF_6$, and metal amidinates, including cobalt and nickel based amidinates.

In one embodiment, the precursor gas 360 and the broad GCIB 320 may be simultaneously injected into the processing chamber 110 for processing of the substrate 126. In another embodiment, the precursor gas 360 may be introduced to the processing chamber 110 in cycles of precursor gas injection followed by GCIB injection and vice versa.

In embodiments where the precursor gas 360 and the broad GCIB 320 may be simultaneously injected into the processing chamber 110, the precursor gas 360 may be injected until reaching a pressure at which the broad GCIB 320 and the precursor gas 360 may collide. Since collisions may cause the gas clusters to lose energy before reaching the substrate 126, pressure in the processing chamber 110 may be maintained low enough such that collisions between the precursor gas 360 and the broad GCIB 320 may be reduced. For example, in one embodiment, the pressure in the processing chamber 110 may be kept in a range varying from approximately $10^{-2}$ Torr to approximately $10^{-1}$ Torr in order to minimize the collisions between the precursor gas 360 and the broad GCIB 320 prior to reaching the substrate 126.

In another embodiment, the broad GCIB 320 may be used to conduct an in-situ pre-clean of the substrate 126 prior to forming a silicide film 380. Pre-cleaning of the substrate 126 may remove contaminants and produce a uniform substrate surface which may benefit further processing steps, including the formation of the silicide film 380. In this embodiment, the source gas 204 may include any suitable etchant gas such as, for example, $NF_3$.

Therefore, by adding an injection device to a processing chamber of a GICB device, low temperature silicide growth may be conducted to form a highly conductive silicide film on a substrate that may include Group III-V materials. As a result, electrical resistance may be reduced, thereby enhancing device performance and potentially increasing product yield and reliability. Additionally, in-situ pre-clean of the substrate may be conducted to improve surface conditions prior to deposition of the silicide film.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a low temperature silicide film on a substrate, the method comprising:
   supplying a source gas to a cluster formation chamber to form a gas cluster;
   moving the gas cluster to an ionization-acceleration chamber to form a gas cluster ion beam (GCIB);
   injecting the GCIB into a processing chamber, the processing chamber containing the substrate;
   injecting a precursor gas through an injection device into the processing chamber, wherein the injection device is positioned on a top portion of the processing chamber in a way such that the precursor gas reaches localized areas of the substrate; and
   forming a silicide film on the substrate by bombarding the substrate with the GCIB in the presence of the precursor gas.

2. The method of claim 1, wherein the injecting the GCIB into the processing chamber is performed through an aperture located between the ionization-acceleration chamber and the processing chamber to form a collimated GCIB.

3. The method of claim 2, wherein the aperture is widen or removed to form a broad GCIB.

4. The method of claim 3, wherein the broad GCIB substantially bombards a surface of the substrate.

5. The method of claim 1, wherein a combination of the source gas and the precursor gas comprises a silicon-source gas and a metal-source gas to form the silicide film on the substrate.

6. The method of claim 5, wherein the silicon-source gas comprises $SiH_2Cl_s$ (DCS), $Si_2H_6$, $SiCl_4$, or $SiHCl_3$.

7. The method of claim 5, wherein the metal-source gas comprises $TiCl_4$, $WF_6$, or a metal amidinate.

8. The method of claim 1, wherein the substrate comprises a Group III-V material such as GaAs and InGaAs.

9. The method of claim 1, wherein the injection device comprises a device having a plurality of openings through which the precursor gas flows.

10. The method of claim 1, wherein the injecting the GCIB into the processing chamber and the injecting the precursor gas through the injection device into the processing chamber is performed simultaneously to induce a chemical reaction at a surface of the substrate to promote growth of the silicide film at a rate that is controlled by flux of the GCIB.

11. The method of claim 1, wherein the injecting the GCIB into the processing chamber and the injecting the precursor gas through the injection device into the processing chamber is performed in cycles of precursor gas injection followed by GCIB injection and vice versa with one or more monolayers of the precursor gas reacting on a surface of the substrate with the incoming GCIB resulting in growth of the silicide film with a thickness controlled by the number of precursor gas and GCIB pulses.

12. The method of claim 1, wherein a pressure in the processing chamber is maintained at approximately 10-6 Torr to approximately 10-2 Torr to reduce the number of collisions between precursor gas and GCIB.

* * * * *